(12) United States Patent
Wen et al.

(10) Patent No.: US 7,979,765 B2
(45) Date of Patent: Jul. 12, 2011

(54) GENERATING DEVICE, GENERATING METHOD, PROGRAM AND RECORDING MEDIUM

(75) Inventors: Xiaoqing Wen, Fukuoka (JP); Seiji Kajihara, Fukuoka (JP); Kohei Miyase, Fukuoka (JP); Yoshihiro Minamoto, Fukuoka (JP); Hiroshi Date, Fukuoka (JP)

(73) Assignees: Japan Science & Technology Agency, Saitama (JP); Kyushu Institute of Technology, Fukuoka (JP); System JD Co., Ltd., Fukuoka (JP)

( * ) Notice: Subject to any disclaimer, the term of this patent is extended or adjusted under 35 U.S.C. 154(b) by 201 days.

(21) Appl. No.: 12/442,996

(22) PCT Filed: Sep. 25, 2007

(86) PCT No.: PCT/JP2007/068505
§ 371 (c)(1),
(2), (4) Date: Mar. 26, 2009

(87) PCT Pub. No.: WO2008/041537
PCT Pub. Date: Apr. 10, 2008

(65) Prior Publication Data
US 2009/0319842 A1 Dec. 24, 2009

(30) Foreign Application Priority Data
Sep. 27, 2006 (JP) .................................. 2006-262764

(51) Int. Cl.
*G01R 31/28* (2006.01)
*G06F 11/00* (2006.01)

(52) U.S. Cl. ........................................ 714/738; 714/726

(58) Field of Classification Search .................. 714/726, 714/738
See application file for complete search history.

(56) References Cited

U.S. PATENT DOCUMENTS
5,515,292 A * 5/1996 Roy et al. ...................... 716/109
(Continued)

FOREIGN PATENT DOCUMENTS
JP 09069909 A * 3/1997

OTHER PUBLICATIONS

Miyase, K.; Kajihara, S.; Pomeranz, I.; Reddy, S.M.; , "Don't-care identification on specific bits of test patterns," Computer Design: VLSI in Computers and Processors, 2002. Proceedings. 2002 IEEE International Conference on , vol., No., pp. 194-199, 2002.*

(Continued)

*Primary Examiner* — Jeffrey A Gaffin
*Assistant Examiner* — Steve Nguyen
(74) *Attorney, Agent, or Firm* — Rankin, Hill & Clark LLP

(57) ABSTRACT

Provided are a generation device and the like for generating a test vector which can reduce capture power efficiently. The generation device 100 generates a test vector for a logic circuit by assigning logic values to each of a plurality of unspecified bits (X-bits) included in a test cube. The generation device 100 includes a selection unit 101 for selecting, among the plurality of X-bits, a target X-bit, which is a target of assigning a logic value, a capture transition metric calculation unit 103 for calculating capture transition metric caused by a test cube including an X-bit, and a logic value assignment unit 105 for assigning, to the selected target X-bit, a logic value which causes the smaller capture transition metric, by applying the capture transition metric calculation means to a first test cube obtained by assigning a logic value 0 to the selected target X-bit and to a second test cube obtained by assigning a logic value 1 to the selected target X-bit, and by comparing a capture transition metric caused by a first test cube and a capture transition metric caused by a second test cube.

10 Claims, 10 Drawing Sheets

U.S. PATENT DOCUMENTS

| | | | |
|---|---|---|---|
| 6,986,090 B2 * | 1/2006 | Hathaway et al. | 714/727 |
| 7,428,681 B2 * | 9/2008 | Kang et al. | 714/738 |
| 7,647,540 B2 * | 1/2010 | Rajski et al. | 714/738 |
| 7,685,491 B2 * | 3/2010 | Lin et al. | 714/738 |
| 7,743,306 B2 * | 6/2010 | Wen et al. | 714/739 |
| 7,779,320 B2 * | 8/2010 | Chmelar | 714/726 |
| 2004/0216021 A1 | 10/2004 | Matsuda et al. | |
| 2005/0149804 A1 | 7/2005 | Hiraide | |
| 2005/0235182 A1 * | 10/2005 | Lee et al. | 714/726 |
| 2006/0107157 A1 | 5/2006 | Wen et al. | |

OTHER PUBLICATIONS

Badereddine, N.; Girard, P.; Pravossoudovitch, S.; Landrault, C.; Virazel, A.; Wunderlich, H.-J.; , "Minimizing peak power consumption during scan testing: test pattern modification with X filling heuristics," Design and Test of Integrated Systems in Nanoscale Technology, 2006. DTIS 2006. International Conference on , vol., No., pp. 359-364, 5-7.*

Seongmoon Wang; Gupta, S.K.; , "An automatic test pattern generator for minimizing switching activity during scan testing activity," Computer-Aided Design of Integrated Circuits and Systems, IEEE Transactions on , vol. 21, No. 8, pp. 954-968, Aug. 2002.*

Rosinger, P.; Al-Hashimi, B.M.; Nicolici, N.; , "Scan architecture with mutually exclusive scan segment activation for shift- and capture-power reduction," Computer-Aided Design of Integrated Circuits and Systems, IEEE Transactions on , vol. 23, No. 7, pp. 1142-1153, Jul. 2004.*

Lennard, C.K.; Buch, P.; Newton, A.R.; , "Logic synthesis using power-sensitive Don't Care sets," Low Power Electronics and Design, 1996., International Symposium on , vol., No., pp. 293-296, Aug. 12-14, 1996.*

Paramasivam, K.; Gunavathi, K.; Sathishkumar, P.; , "Algorithm for low power combinational circuit testing," TENCON 2004. 2004 IEEE Region 10 Conference , vol. D, No., pp. 336-339 vol. 4, Nov. 21-24, 2004.*

Kajihara, S.; Ishida, K.; Miyase, K.; , "Test vector modification for power reduction during scan testing," VLSI Test Symposium, 2002. (VTS 2002). Proceedings 20th IEEE , vol., No., pp. 160-165, 2002.*

Badereddine, N.; Girard, P.; Pravossoudovitch, S.; Landrault, C.; Virazel, A.; Wunderlich, H.-J.; , "Minimizing Peak Power Consumption during Scan Testing: Structural Technique for Don't Care Bits Assignment," Research in Microelectronics and Electronics 2006, Ph. D. , vol., No., pp. 65-68, 0-0 0.*

Li Xiaoyong; Ji Lijiu; , "Quadru-tree algorithm for transition probability in CMOS IC power estimation," Solid-State and Integrated Circuit Technology, 1998. Proceedings. 1998 5th International Conference on , vol., No., pp. 492-495, 1998.*

Akita, J.; Asada, I.; , "A method for reducing power consumption of CMOS logic based on signal transition probability," European Design and Test Conference, 1994. EDAC, The European Conference on Design Automation. ETC European Test Conference. EUROASIC, The European Event in ASIC Design, Proceedings. , vol., No., pp. 420-424, 28 Feb-3 Mar 1.*

International Search Report for PCT/JP2007/068505 dated Dec. 25, 2007.

* cited by examiner

GENERATING DEVICE, GENERATING METHOD, PROGRAM AND RECORDING MEDIUM

TECHNICAL FIELD

The present invention relates to a generation device, generation method, a program capable of causing a computer to execute a generation method, and a recording medium recording this program. More specifically, the present invention relates to a generation device and the like for generating a test vector, for a logic circuit, by assigning logic values to each of a plurality of unspecified bits (X-bits) included in a test cube.

BACKGROUND ART

As shown in FIG. 8, a semiconductor logic circuit is shipped through three stages, which are designing, manufacture and testing stages. In the testing stage, a test vector, wherein the logic value of each logic bit is determined as either 0 or 1, is applied to the manufactured semiconductor logic circuit, and a test response from the semiconductor logic circuit is observed and compared to an expected test response, so that it is judged if the circuit is defective or non-defective. A ratio by which the non-defective products can be obtained is called yield, and the yield largely affects the quality, reliability and manufacturing costs of the semiconductor logic circuit.

In general, the manufactured semiconductor logic circuit is mostly a sequential circuit. The sequential circuit comprises a combinational circuit unit including one or a plurality of AND gates, one or a plurality of NAND gates, one or a plurality of OR gates, one or a plurality of NOR gates and the like, and flip-flops for memorizing internal states of the circuit. Hereupon, the combinational circuit unit comprises an external input pin (primary input: PI), a pseudo external input pin (pseudo primary input: PPI) which is an output pin of the flip-flop, an external output pin (primary output: PO), and a pseudo external output pin (pseudo primary output: PPO) which is an input pin of the flip-flop. Inputs to the combinational circuit unit include those directly supplied from the primary input and those supplied via the pseudo primary input. Outputs from the combinational circuit unit include those appearing on the primary output directly and those appearing on the pseudo primary output.

In order to test the combinational circuit unit of the sequential circuit, it is necessary to apply a required test vector from the primary input and the pseudo primary input of the combinational circuit unit and observe a test response from the primary output and the pseudo primary output of the combinational circuit unit. Bits corresponding to the primary input and the pseudo primary input constitute one test vector, and bits corresponding to the primary output and the pseudo primary output constitute one test response.

However, in general, the output pin (pseudo external input pin) and the input pin (pseudo external output pin) of the flip-flop of the sequential circuit cannot be directly accessed from outside. Therefore, there are problems in the controllability of the pseudo primary input and the observability of the pseudo primary output when the combinational circuit unit is tested.

A method of solving the problems described above in the controllability and observability in the test of the combinational circuit unit which is mostly adopted is the full-scan design. Describing the full-scan design, the flip-flops are replaced with scan flip-flops, and the scan flip-flops are used to form one or a plurality of scan chains. The operation of the scan flip-flops is controlled by a scan enable (SE) signal pin. For example, when SE=0, the operation of the scan flip-flops is the same as that of the conventional flip-flops, and output values of the scan flip-flops are updated by a value from the combinational circuit unit when a clock pulse is given thereto. When SE=1, the scan flip-flop and another scan flip-flop in the same scan chain form one shift register, and new values are shifted into the scan flip-flops from outside and current values in the scan flip-flops are shifted out therefrom when the clock pulse is given thereto. The scan flop-flops in the same scan chain conventionally share the same scan enable (SE) signal pin, however, the scan flop-flips in the different scan chains may share the same scan enable (SE) signal pin or may respectively use different ones.

The combinational circuit unit of the full-scan sequential circuit is tested in such a manner that scan shift and scan capture are repeated. The scan shift is performed in shift mode wherein the scan enable (SE) signal pin is set to logic value 1. In the shift mode, one or a plurality of clock pulses is given, and one or a plurality of new values is shifted into the scan flip-flops in the scan chain from outside, and, at the same time, one or a plurality of current values in the scan flip-flops in the scan chain is shifted out therefrom. The scan capture is performed in capture mode wherein the scan enable (SE) signal pin is set to logic value 0. In the capture mode, one clock pulse is simultaneously given to all of the scan flip-flops in one scan chain, and a value of the pseudo primary output in the combinational circuit unit is captured into all of the scan flip-flops.

The scan shift is used in order to apply the test vector to the combinational circuit unit via the pseudo primary input and observe the test response from the combinational circuit unit via the pseudo primary output. Further, the scan capture is used to capture the test response from the combinational circuit unit into the scan flip-flops. All of the test vectors are subjected to the scan shift and the scan capture so that the combinational circuit unit can be tested. Such a test method is called the scan test method.

In the scan test method, the test vector may be applied to the combinational circuit unit directly via the external input or by means of the scan shift. Because an arbitrary logic value can be set in an arbitrary scan flip-flop by the scan shift, the problem in the controllability of the pseudo primary input can be solved. The observation of the test response from the combinational circuit unit may be performed directly via the external output or by means of the scan shift. Because the output value of the arbitrary scan flip-flop can be observed by means of the scan shift, the problem in the observability of the pseudo primary output can be solved. As described, it is only required in the scan test method to obtain the test vector and the expected test response using an automatic test pattern generation (ATPG) program.

The scan test method described above, which is a very effective means, still includes the problem that more power is consumed in the test than in a normal operation. In the case where a CMOS circuit constitutes a semiconductor logic circuit, the power consumption includes static power consumption due to leak current and dynamic power consumption due to the switching activity of logic gates and flip-flops. Further, the latter power consumption, which is the dynamic power consumption, includes shift power consumption in a shift operation and capture power consumption in a capture operation.

A large number of clock pulses are conventionally given to one test vector at the time of the scan shift. For example, it is necessary to supply as many clock pulses as the number of the scan flip-flops at maximum in order to set new values in all of the scan flip-flops in one scan chain. Therefore, the shift power consumption is thereby increased, which may cause excessive heat. The excessive heat may lead to the breakage of the semiconductor logic circuit. Therefore, a method of reducing the shift power consumption has been actively studied.

The number of the clock pulses necessary for one test vector at the time of the scan capture is conventionally one for one scan chain. Therefore, the heat resulting from the scan capture power consumption does not present any problem. However, if there is a difference between the test response value and the current value of the scan flip-flop when the test response of the combinational circuit unit appearing on the pseudo primary output is captured into the scan flip-flop in the capture mode, the output value of the corresponding scan flip-flop changes. In the case where there is a large number of scan flip-flops which thus change the output values, a power supply voltage tentatively drops due to the switching activity of the logic gates and the scan flip-flops, which is called the IR (I: current, R: resistance) drop. The IR-drop may result the malfunction of the circuit, as a result of which a wrong test value may be captured into the scan flip-flop. Accordingly, the semiconductor logic circuit normally operable in a normal operation, may be wrongly judged to be a defective product when tested. As a result, the yield is deteriorated. In the case where the semiconductor logic circuit achieves a large scale, ultra-miniaturization and lower power supply voltage, the yield loss induced by the false test is evident. Therefore, it is necessary to reduce the capture power consumption.

In the case where a single clock is used in the test, the scan capture power consumption can be reduced by means of the clock gating method, which, however, largely affects the physical design of the semiconductor logic circuit. In the case where a multiple clock signal is used in the test, the scan capture power consumption can be reduced by means of the one-hot method or multiple clock method. However, a test data volume is significantly increased in the first, while an enormous amount of memory consumption is necessary for the generation of the test vector in the latter, which both impose a significant burden on the ATPG. In the process of reducing the scan capture power consumption, it is desirable to minimize the influence on the physical design, the increase of the test data volume and the burden on the ATPG.

A test cube including don't care bits, that is, a logic bit which can be either the logic value 0 or the logic value 1 for achieving a predetermined object, is often generated in the process where the test vector is generated according to the ATPG program. In contrast, a test input not including the don't care bits but only includes logic bits (bits having the logic value 0 or logic value 1) is called a test vector. In the case where a test vector set not including the don't care bits is supplied, a part of the bits of a part of the test vectors can be set as the don't care bits without any change to a fault coverage of the set. In other words, the test cube can be obtained by a don't care bit specified program. The test cube is present because one or a plurality of target faults in the combinational circuit unit of the full-scan sequential circuit can be often detected when the necessary logic values are simply set in a part of the bits in the primary input and the pseudo primary input. Though 0 or 1 is set in the rest of the bits, the target faults are still detected. Therefore, such bits unrelated to the detection are the don't care bits for the target faults.

By the way, X-filling is the process of assigning logic values to the unspecified bits (X-bits) in a test cube so as to obtain a fully-specified test vector with a certain characteristic. Because of no need of circuit modification or ATPG algorism modification, X-filling is evaluated to be acceptable for capture power reduction. X-filling methods for capture power reduction are different from random X-filling. And they can be collectively called LCP (Low-Capture-Power) X-filling. As shown in Non-Patent Document 1, 2, 3 and 4, LCP X-filling methods are proposed as new X-filling methods. In addition to no circuit/ATPG impact, one more important advantage of LCP X-filling is its compatibility with any shift power reduction solution that is not based on the use of X-bits. As a result, total (shift and capture) test power reduction can be achieved.

FIG. 9 shows an example of using MD-SCAN (multi-duty scan) (Refer to Non-Patent Document 5) for shift power reduction and LCP X-filling for capture power reduction.

MD-SCAN lowers shift power by using multiple shift clock phases to reduce the number of simultaneously-operating FFs. It cannot reduce capture power, however, since only one capture clock phase is used in order to contain ATPG complexity and memory usage. Nonetheless, since MD-SCAN does not rely on X-bits, LCP X-filling can use the X-bits to generate test vectors with low capture power. This leads to a complete solution for total scan test power reduction. In many cases, capture power reduction is more critical than shift power reduction. For example, in the case shown in FIG. 9, shift power can be readily reduced to 1/n if n shift clock phases are used. However, if capture power is not sufficiently reduced, the goal of total scan test power reduction cannot be achieved. Therefore, it is highly required to reduce capture power as effective as possible.

Non-Patent Document 1: K. M. Butler, J. Saxena, T Fryars, G. Hetherington, A. Jain, and J. Levis, "Minimizing Power Consumption in Scan testing: Pattern Generation and DFT Techniques," Proc. Intl. Test Conf., pp. 355-364, 2004.

Non-Patent Document 2: R. Sankaralingam, R. Oruganti and N. Touba, "Static Compaction Techniques to Control Scan Vector Power Dissipation," Proc. of VLSI Test Symp., pp. 35-42, 2000.

Non-Patent Document 3: X. Wen, Y. Yamashita, S. Kajihara, L.-T. Wang, K. K. Saluja, and K. Kinoshita, "Low-Capture-Power Test Generation for Scan-Based At-Speed Testing," Proc. Intl. Test Conf., Paper 39-2, 2005.

Non-Patent Document 4: X. Wen, H. Yamashita, S, Kajihara, L.-T. Wang, K. Saluja, and K. Kinoshita, "On Low-Capture-Power Test Generation for Scan testing," Proc. VLSI Test Symp., pp. 265-270, 2005.

Non-Patent Document 5: T. Yoshida and M. Watari, "A New Approach for Low Power Scan testing," Proc. Intl. Test Conf., pp. 480-487, 2003.

DISCLOSURE OF THE INVENTION

Problems to be Solved by the Invention

However, the effectiveness of previous LCP X-filling methods is far from being satisfactory. The major reason is that they suffer from the problems of lack of guidance in two key operations in X-filling, the operation for X-bits target selection and the operation for X-filling value selection. The first is called "X-filling target selection problem," and the second is "X-filling value selection problem."

Firstly, the X-filling target selection problem is described. A test cube often has multiple X-bits, and different X-filling orders for the X-bits lead to different results in capture power reduction.

FIG. 10 describes the difference of results caused by selection in different X-filling orders. Here, "Comb. Portion"

means combinational portion, and "Before Capture" and "After Capture" in FIG. 10 point out logic values before and after capture, respectively.

As shown in FIG. 10(a), the test cube v has two X-bits, represented by Xb and Xc, respectively. If Xc is X-filled before Xb with an LCP X-filling method [Non-Patent Document 3], the resulting test vector is v1 and its weighted capture transition metric is 4 as shown in FIG. 10(b). The weighted capture transition metric is an effective metric for capture power estimation as described later. However, if Xb is X-filled before Xc, the resulting test vector is v2 and its weighted capture transition metric is 0 as shown in FIG. 10(c). Clearly, the guidance provided in X-filling target selection in FIG. 10(c) is more effective than that of FIG. 10(b), with respect to capture power reduction.

However, previous LCP X-filling methods provide no sufficient guidance for X-filling target selection. That is, previous LCP X-filling methods usually select an X-filling target in a random manner, or by a simple heuristic without a close correlation with capture power reduction (Non-Patent Document 3 and 4). This lack of guidance in X-filling target selection causes inappropriate X-filling orders and adversely affects the result of capture power reduction.

Secondly, X-filling value selection problem is described. After the target X-bit for the current X-filling run is selected, a proper logic value (0 or 1) should be selected for the target X-bit in order to reduce capture power as much as possible. However, some previous LCP X-filling methods shown in Non-Patent Document 1 and Non-Patent Document 2 only try to reduce logic value transitions inside the resulting test vector by using such techniques as 0-filling, 1-filling, and minimum-transition-filling, without considering the impact of these techniques on capture power. Other previous LCP X-filling methods shown in Non-Patent Document 3 and Non-Patent Document 4 only try to reduce the number of logic value transitions at the outputs of scan FFs, which does not necessarily have a good correlation with the total capture power of the whole circuit (gates and FFs). That is, after the target X-bit for the current X-filling run is selected, a proper logic value should be selected for it in order to reduce capture power as much as possible. For X-filling value selection, it is necessary to estimate the impacts of both 0-selection and 1-selection on capture power reduction, so as to determine which logic value, 0 or 1, is better to be used as the final logic value for the X-bit. Obviously, an sufficiently-accurate and easy-to-calculate metric for capture power estimation needs to be used as a guidance. However, previous LCP X-filling methods lack sufficient guidance in X-filling value selection. Such insufficient guidance in X-filling value selection also adversely affects the result of capture power reduction.

For a fully-specified test vector v, its weighted capture transition metric, denoted by WCT (v), is a good metric for capture power estimation, as defined bellow.

$$WCT(v) = \sum_{i=1}^{n} (w_i \times t_i)$$

Here, n is the number of all nodes (gates in the combinational portion and FFs in the scan chains) in a circuit, wi is number of fanout branches from node i, and ti indicates whether a capture transition occurs at the output of node i. Here, ti=1 if a capture transition occurs, otherwise ti=0. Note that wi is used to approximate the parasitic capacitance at node i. For example, consider v1 shown in FIG. 10 (b). Since there are three capture transitions at G1, G3, and FF1 that have 1, 1, and 2 fanout branches, respectively, it is obvious that WCT(v1)=1×1+1×1+1×2=4

The weighted capture transition metric is tailored from the general concept of weighted switching activity to fit into capture power estimation. Since it takes all nodes and their fanout branches into consideration, this metric provides sufficiently-accurate estimation on capture power dissipation caused by a test vector, without resorting to costly simulation-based power analysis.

However, the weighted capture transition metric is a deterministic metric. That is, it can be used only for a fully specified test vector, not for a test cube with X-bits. This is because, since X-bits exist in a test cube, the outputs of some nodes could also be X's before and/or after capture. For example, if the output of a node is X before capture and 1 after capture, it is impossible to deterministically know whether a capture transition occurs at the node.

Therefore, the weighted capture transition metric cannot be used as a guidance in X-filling value selection. This is because a test cube often still has X-bits after one of its X-bits is filled with 0 or 1, but the weighted capture transition metric can only be used for a test vector without X-bits.

It is, therefore, an object of the present invention to provide a generation device, generation method, a program capable of causing a computer to execute a generation method, and a recording medium recording this program, for generating a test vector which can efficiently reduce capture power.

Means for Solving the Problems

A first aspect in accordance with the present invention provides a generation device for generating a test vector for a logic circuit by assigning a logic value to each of a plurality of unspecified bits (X-bits) included in a test cube, the logic circuit being full-scan sequential circuit, the generation device comprising selection means for selecting, among the plurality of X-bits, a target X-bit, which is an X-bit to which a logic value is to be assigned, where the selection is based on a selection criterion serving a given purpose, capture transition metric calculation means for calculating capture transition metric for a test cube including at least one X-bit, with outputs of all of logic elements in the logic circuit, and logic value assignment means for assigning, to the selected target X-bit, a logic value which causes the smaller capture transition metric, by applying the capture transition metric calculation means to a first test cube obtained by assigning a logic value 0 to the selected target X-bit and to a second test cube obtained by assigning a logic value 1 to the selected target X-bit, and by comparing a capture transition metric caused by a first test cube and a capture transition metric caused by a second test cube, wherein logic values are assigned to target X-bits based on calculation results by the capture transition metric calculation means until logic values are assigned to all of the plurality of X-bits.

A second aspect in accordance with the present invention provides the generation device according to the first aspect, wherein the selection means selects the target X-bit based on degree of spread of signal value transition in the logic circuit_ from each of the plurality of X-bits.

A third aspect in accordance with the present invention provides the generation device according to the first or second aspect, wherein the capture transition metric calculation means calculates capture transition metric caused by the test cube, based on calculation results of probabilities of signal transitions obtained by calculating signal probabilities in all of logic elements constituting the logic circuit before and after scan capture, and by calculating the probabilities of signal transitions in all the logic elements based on calculation results of the signal probabilities.

A fourth aspect in accordance with the present invention provides the generation device according to any of the first through third aspect, wherein the logic value assignment means comprises comparison means for comparing a capture transition metric caused by a first test cube obtained by assigning a logic value 0 to the selected target X-bit and a capture transition metric caused by a second test cube obtained by assigning a logic value 1 to the selected target X-bit and decision means for deciding a logic value, 0 or 1, as a logic value to be assigned, corresponding to the smaller capture transition metric, based on the comparison result obtained by the comparison means.

A fifth aspect in accordance with the present invention provides the generation device according to any of the first through fourth aspect, wherein the capture transition metric calculation means assumes and applies probability of logic value of the selected target X-bit to be 1 or probability of logic value of the selected target X-bit to be 0 as transition probability.

A sixth aspect in accordance with the present invention provides a generation method for generating a test vector for a logic circuit by assigning a logic value to each of a plurality of unspecified bits (X-bits) included in a test cube, the logic circuit being full-scan sequential circuit, the generation method comprising a selection step of causing selection means to select, among the plurality of X-bits, a target X-bit, which is an X-bit to which a logic value is to be assigned, where the selection is based on a selection criterion serving a given purpose, a capture transition metric calculation step of causing capture transition metric calculation means to calculate capture transition metric for a test cube including at least one X-bit, with outputs of all of logic elements in the logic circuit, and a logic value assignment step of causing logic value assignment means to assign, to the selected target X-bit, a logic value which causes the smaller capture transition metric, by applying the capture transition metric calculation means to a first test cube obtained by assigning a logic value 0 to the selected target X-bit and to a second test cube obtained by assigning a logic value 1 to the selected target X-bit, and by comparing a capture transition metric caused by a first test cube and a capture transition metric caused by a second test cube, wherein logic values are assigned to target X-bits based on calculation results by the capture transition metric calculation means until logic values are assigned to all of the plurality of X-bits.

A seventh aspect in accordance with the present invention provides the generation method according to the sixth aspect, wherein, in the selection step, the selection means selects the target X-bit based on degree of spread of signal value transition in the logic circuit from each of the plurality of X-bits.

A eighth aspect in accordance with the present invention provides the generation method according to the sixth or seventh aspect, wherein, in the capture transition metric calculation step, the capture transition metric calculation means calculates capture transition metric caused by the test cube, based on calculation results of probabilities of signal transitions obtained by calculating signal probabilities in all of logic elements constituting the logic circuit before and after scan capture, and by calculating the probabilities of signal transitions in all the logic elements based on calculation results of the signal probabilities.

A ninth aspect in accordance with the present invention provides the generation device according to any of the sixth through eighth aspect, wherein the logic value assignment step comprises a comparison step of causing comparison means to compare a capture transition metric caused by a first test cube obtained by assigning a logic value 0 to the selected target X-bit and a capture transition metric caused by a second test cube obtained by assigning a logic value 1 to the selected target X-bit and a decision step of causing decision means to decide a logic value, 0 or 1, as a logic value to be assigned, corresponding to the smaller capture transition metric, based on the comparison result obtained by the comparison means.

A tenth aspect in accordance with the present invention provides the generation device according to any of the sixth through ninth aspect, wherein, in the capture transition metric calculation step, the capture transition metric calculation means assumes and applies probability of logic value of the selected target X-bit to be 1 or probability of logic value of the selected target X-bit to be 0 as transition probability.

An eleventh aspect in accordance with the present invention provides a program capable of causing a computer to execute the generation method according to any of the sixth through tenth aspect.

A twelfth aspect in accordance with the present invention provides a recording medium recording the program according to the eleventh aspect so as to be able to cause a computer to execute the program.

EFFECT OF THE INVENTION

According to the present invention, the "X-filling target selection problem" can be solved by selection means, and the "X-filling value selection problem" can be solved by capture transition metric calculation means and logic value assignment means. Thereby, it is possible to generate a test vector which can efficiently reduce capture power. If the logic circuit is a full-scan sequential circuit, it is also possible to reduce the transition metric not only of scan FFs but also of the whole logic circuit.

DESCRIPTION OF REFERENCE SYMBOLS

100 generation device
101 selection unit 103 capture transition metric calculation unit
105 logic value assignment unit

PREFERRED EMBODIMENT OF THE INVENTION

LCP X-filling described below is conducted for the X-bits in a test cube for the purpose of reducing the capture power of the resulting test vector.

Figure 1:
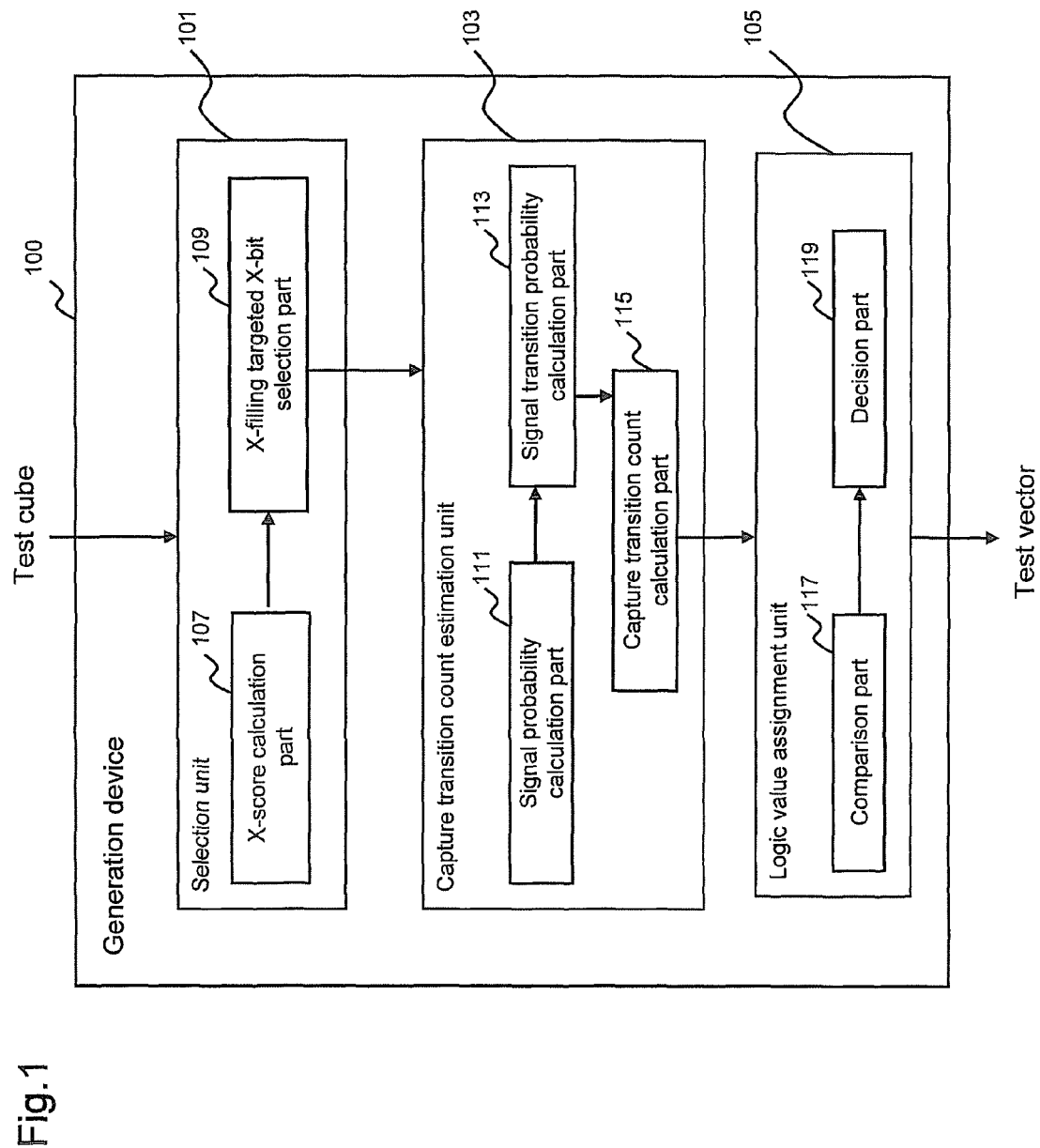
FIG. 1 is a schematic block diagram of the generation device in accordance with an embodiment of the present invention.
Figure 2:
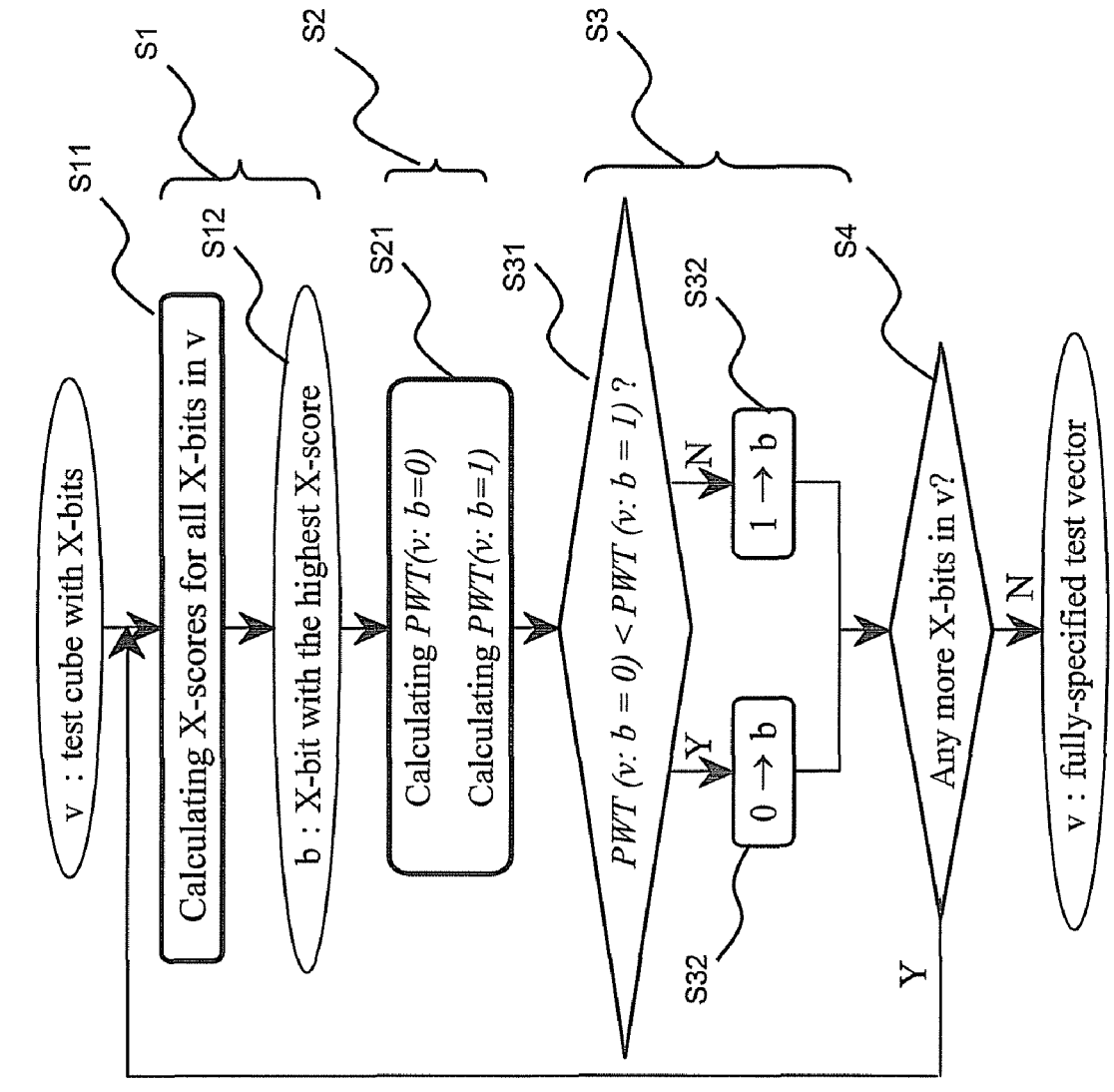
FIG. 2 is a flow diagram which explains the behavior of the generation device in FIG. 1.

FIG. 1 is a schematic block diagram of the generation device in accordance with an embodiment of the present invention. FIG. 2 is a flow diagram which explains the behavior of the generation device in FIG. 1.

FIG. 2 shows the operation in FIG. 1 and the general overview of the new LCP X-filling method that provides sufficient guidance in X-filling, based on two concepts of the "X-score" and the "probabilistic weighted capture transition metric," which will be described later.

The generation device 100 includes a selection unit 101, a capture transition metric calculation unit 103, and a logic value assignment unit 105. The selection unit 101 includes an X-score calculation part 107 and a target X-bit selection part 109. The capture transition metric calculation unit 103 includes a signal probability calculation part 111, a signal transition probability calculation part 113, and a capture transition metric calculation part 115. The logic value assignment unit 105 includes a comparison part 117 and a decision part 119. The generation device 100 generates a test vector from a given test cube. Each component will be described more below.

The selection unit 101 selects, among the plurality of X-bits, a target X-bit, which is an X-bit to which a logic value is to be assigned, where the selection is based on a selection criterion, by calculating X-scores for LCP with the X-score calculation part 107, and by choosing an X-bit with the largest X-score as the X-filling target with target X-bit selection part 109. Here, X-score is an example of degree of spread of signal value transition in the logic circuit from each of the plurality of X-bits.

The capture transition metric calculation unit 103 calculates capture transition metric for a test cube including at least one X-bit, with outputs of all of logic elements in the logic circuit. Concretely, the signal probability calculation part 111 calculates signal probabilities in all of logic elements constituting the logic circuit before and after scan capture. The signal transition probability calculation part 113 calculates the probabilities of signal transitions in all the logic elements based on calculation results of the signal probabilities. And the capture transition metric calculation part 115 calculates capture transition metric for the test cube, based on calculation results of probabilities of signal transitions.

The logic value assignment unit 105 assigns, to the selected target X-bit, a logic value which causes the smaller capture transition metric, by applying the capture transition metric calculation unit 103 to a first test cube obtained by assigning a logic value 0 to the selected target X-bit by the selection unit 101 and to a second test cube obtained by assigning a logic value 1 to the selected target X-bit by the selection unit 101, and by comparing a capture transition metric caused by a first test cube and a capture transition metric caused by a second test cube. Logic values are assigned to target X-bits based on calculation results by the capture transition metric calculation unit 103 until logic values are assigned to all of the plurality of X-bits. Here, the comparison part 117 compares a capture transition metric caused by a first test cube obtained by assigning a logic value 0 to the selected target X-bit and a capture transition metric caused by a second test cube obtained by assigning a logic value 1 to the selected target X-bit, and the decision part 119 decides a logic value, 0 or 1, as a logic value to be assigned, corresponding to the smaller capture transition metric, based on the comparison result obtained by the comparison part 117.

In FIG. 2, the new LCP X-filling method consists of three basic operations: properly selecting a target X-bit for each X-filling run by a selection unit 101 (step S1), calculating the capture transition metric by a capture transition metric calculation unit 103 (step S2), and determining a proper logic value for the target X-bit, so as to reduce capture power as much as possible, by a logic value assignment unit 105 (step S3). In step S4, the basic operation (step S1), the basic operation (step S2), and the basic operation (step S3) are repeated until there are no more X-bits in the test cube, and the result is a fully-specified test vector.

The X-filling target selection by the selection unit 101 (step S1) is conducted by calculating the X-score for each X-bit in a test cube by X-score calculation part 107 (step S11) and then choosing the one with the largest X-score as the X-filling target for the current X-filling run by target X-bit selection part 109 (step S12) Details on X-score are provided later.

On the other hand, capture transition metric calculation by the capture transition metric calculation unit 103 (step S2) is conducted by calculating the probabilistic weighted capture transition metrics (PWT described later is an example) (step S21).

And in X-filling value selection for the target X-bit b in the test cube v by the logic value assignment unit 105 (step S3), the logic value corresponding to the smaller transition metric is selected as the final logic value for the target X-bit (step S31 and S32). Details are provided later.

The X-Filling Target Selection (step S1) will be described more below.

In order to properly select the X-filling target for the current X-filling run, it is necessary to consider the following factors: (1) the circuit structure, (2) the values and locations of specified bits, and (3) the locations of X-bits. Information on these factors is obtained by a technique called set-simulation, which is an extension to the X-simulation technique.

Set-simulation will be described below. Set-simulation is conducted for a test cube v in a full-scan circuit by using the following procedure.

<Step-1: Input Set Assignment>

Suppose that the test cube v has n X-bits. Replace the n X-bits with n different sets: $\{1\}, \{2\}, \ldots,$ and $\{n\}$.

<Step-2: Set Propagation>

Conduct set propagation in the combinational portion of the full-scan circuit until the output of all gate has either a logic value or a set, by repeatedly applying Rule I and Rule II described below.

Rule-I: If the output of a gate is the inversion of one of its inputs and the input has the set S ($_{-}$S), then place $_{-}$S (S) on the output of the gate.

Rule-II: Suppose that a total of p inputs of a gate have sets S1, S2, . . . , and Sp. If the output of the gate is neither a logic value nor the inversion of any of its inputs, place the set S1 ∪ S2 ∪ . . . ∪ Sp on the output of the gate.

<Step-3: FF Set Assignment>

After a logic value or a set is determined at a pseudo primary output of the combinational portion, assign the logic value or the set of the pseudo primary output to the output of its corresponding FF.

Figure 3:
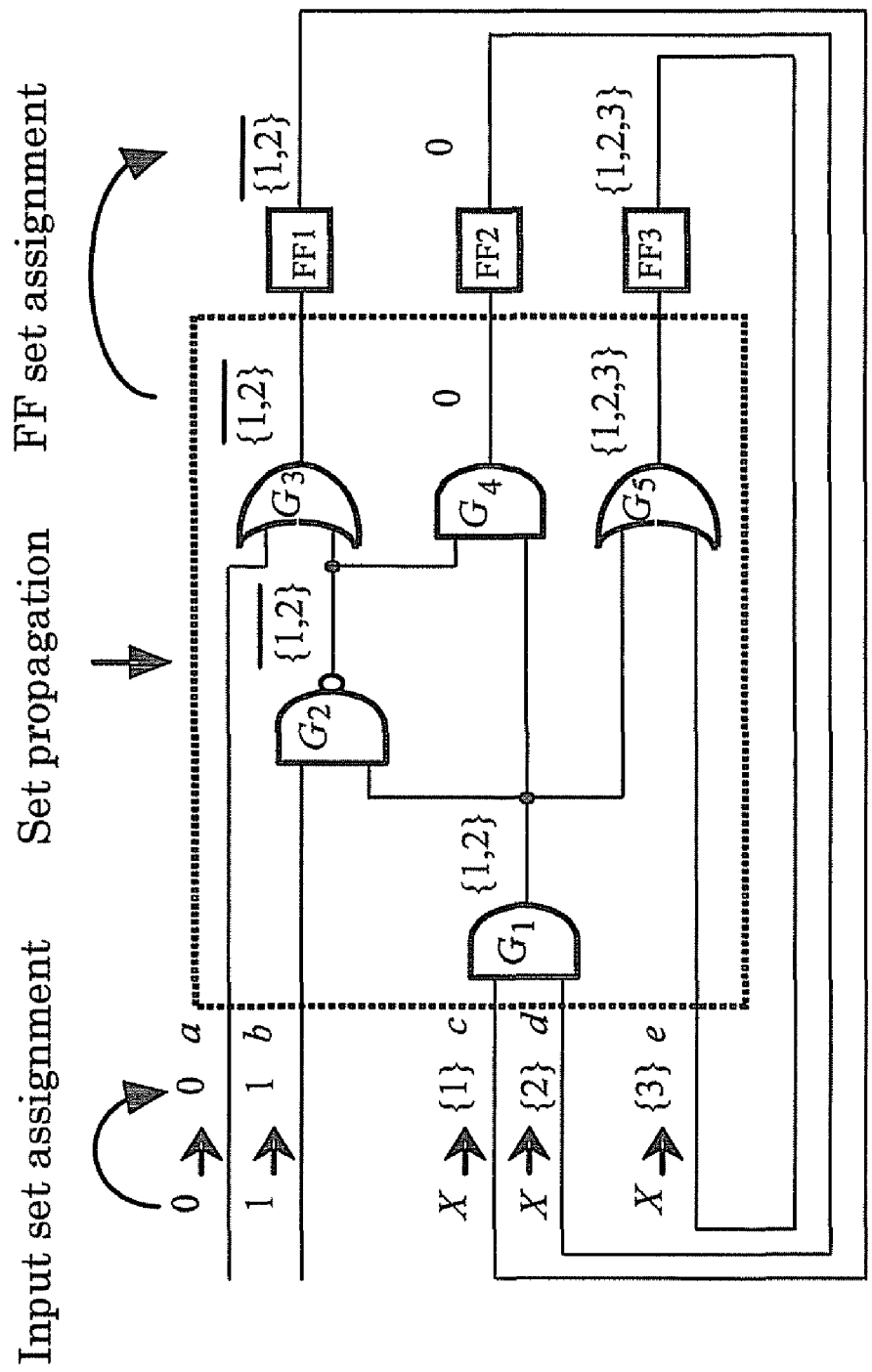
FIG. 3 shows an example of set-simulation.

An example of set-simulation is shown in FIG. 3.

Generally, set-simulation for a test cube reveals the impact of each X-bit on logic values of nodes as follows: (1) a logic value on the output of a node indicates that no X-bit has any impact on the node, and (2) a set {p1, p2, . . . , pm} on the output of a node indicates that the logic value of the node is affected by the p1-th X-bit, the p2-th X-bit, . . . , and the pm-th X-bit in the test cube.

This result of set-simulation is used in calculating X-scores. X-score is quantitative guidance in X-filling target selection.

The definition of X-score will be described below. Suppose that the outputs of a total of m nodes (gates and FFs) in a full-scan circuit have sets of numbers, S1, S2, . . . , and Sm, after set-simulation is conducted for a test cube. Also suppose that nbit is the number assigned to an X-bit bit in the test cube in the Step-1 (Input Set Assignment) of the set-simulation procedure. In this case, the X-score of the X-bit bit is defined in formula as follows.

$$X-Score(bit) = \sum_{i=1}^{m} (r_i / |S_i|)$$

Here, ri=1 if nbit ∈ Si; otherwise, ri=0. For example, for the result of set-simulation shown in FIG. 3 the outputs of nodes G1, G2, G3, G5, FF1, and FF3 have sets {1,2}, {1,2}, {1,2}, {1,2,3}, {1,2}, and {1,2,3}, respectively. In addition, the number 3 is assigned to the X-bit e in the Step-1 of set-simulation. Therefore, the X-score of the X-bit(e) can be calculated as follows.

X-Score(e)=0/2+0/2+0/2+1/3+0/2+1/3=0.67

From the definition of X-score, it is clear that the larger the X-score of an X-bit is, the more impact assigning a logic value to the X-bit has on the values of nodes in a full-scan circuit. Thus, an X-bit with a larger X-score indicates that the X-bit has more impact on capture power dissipation.

As shown in FIG. 2, the proposed X-filling target selection method first calculates the X-scores of all X-bits in a test cube, and then selects the X-bit with the highest X-score as the X-filling target for the current X-filling run.

Figure 4:
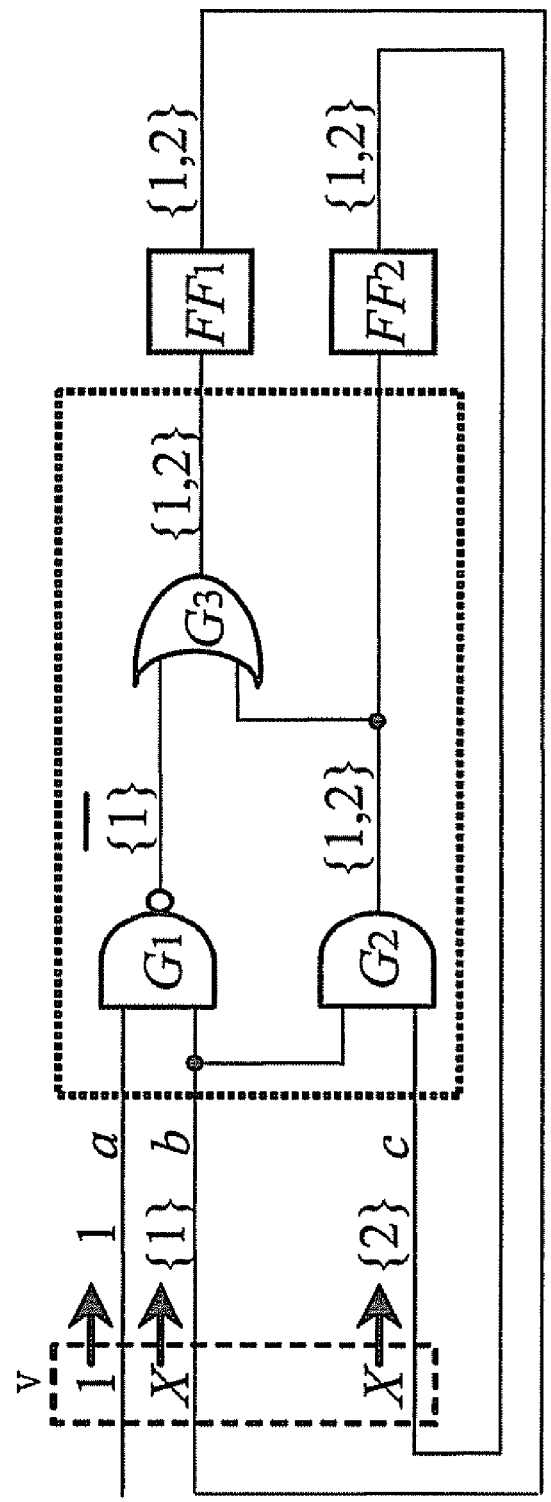
FIG. 4 explains the effect of using X-score as quantitative guidance.

FIG. 4 is for explanation of the effect of using X-score as quantitative guidance.

The test cube v has two X-bits on b and c as shown in FIG. 4, X-score(b) and X-score(c) are 3 and 2, respectively.

X-Score(b)=1+1/2+1/2+1/2+1/2=3

X-Score(c)=1/2+1/2+1/2+1/2=2

Therefore, b is selected as the first target X-bit for X-filling, and c is the second. This order of X-filling leads to a better result in capture power reduction.

Next, capture transition metric calculation (step S2) will be described more below.

In order to reduce capture power as much as possible, a proper logic value needs to be selected for the target X-bit in each X-filling run. Determining whether a logic value is proper for an X-bit in the process of X-filling requires sufficiently-accurate estimation on capture power for a test cube with X-bits. In the following, a new metric is defined for capture power estimation of a test cube, and details on its calculation are also described. Based on the new metric, highly-guided X-filling value selection is achieved.

The probabilistic weighted capture transition metric of a circuit for the capture operation under a test cube v is denoted by PWT(v) and defined as follows.

$$PWT(v) = \sum_{i=1}^{n} (w_i \times p_i)$$

Here, n is the number of all nodes (gates in the combinational portion and FFs in the scan chains) of the circuit, wi is number of fanout branches from node i, and pi is the probability that a transition (0 to 1 or 1 to 0) occurs at the output of node i.

The probabilistic weighted capture transition metric (PWT) is similar to the previous weighted capture transition metric (WCT). The most significant difference is that PWT uses the concept of transition probability to handle un-deterministic transitions associated with X-bits in a test cube, while WCT can only handle deterministic transitions for a fully-specified test vector. For example, if the output of a node is X before capture and 1 after capture, it is impossible to determine whether a transition (0 to 1) will occur at this node with 100% certainty.

In order to address this uncertainty, the concept of transition probability is introduced. Generally, the transition probability pi at node i for the capture operation under a test cube v can be calculated as follows.

pi=(BC-Prob0(i)×AC-Prob1(i))+(BC-Prob1(i)× AC-Prob0(i))

Here, BC-Prob0(i) and BC-Prob1(i) denote the probabilities of node i having 0 and 1 before capture (BC), respectively, while AC-Prob0(i) and AC-Prob1(i) denote the probabilities of node i having 0 and 1 after capture (AC), respectively.

Once transition probabilities of all nodes for v are obtained, PWT (v) can be readily calculated. The most significant benefit of the PWT metric is its capability to calculate capture power of the whole circuit even for a test cube with X-bits. This makes it useful in guiding X-filling value selection to reduce capture power as much as possible.

Figure 5:
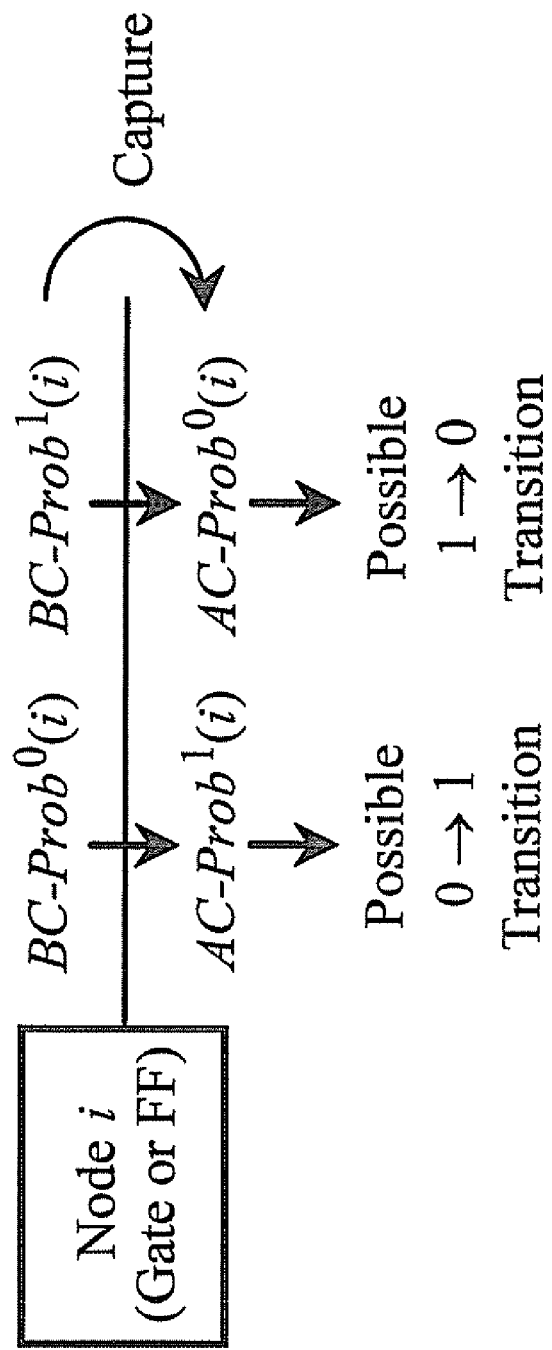
FIG. 5 explains the key issue in applying the PWT metric to obtain the transition probabilities of all nodes under a test cube v.

As shown in FIG. 5, the key issue in applying the PWT metric is to obtain the transition probabilities of all nodes under a test cube v.

As shown in FIG. 5, this requires to calculate four node probabilities, BC-Prob0(i), BC-Prob1(i), AC-Prob0(i), and AC-Prob1(i), for each node i. Although BC-Prob0(i)+BCProb1(i)=1 and AC-Prob0(i)+AC-Prob1(i)=1, all the four probabilities are explicitly shown for each node in the following for the ease of comprehension.

Figure 6:
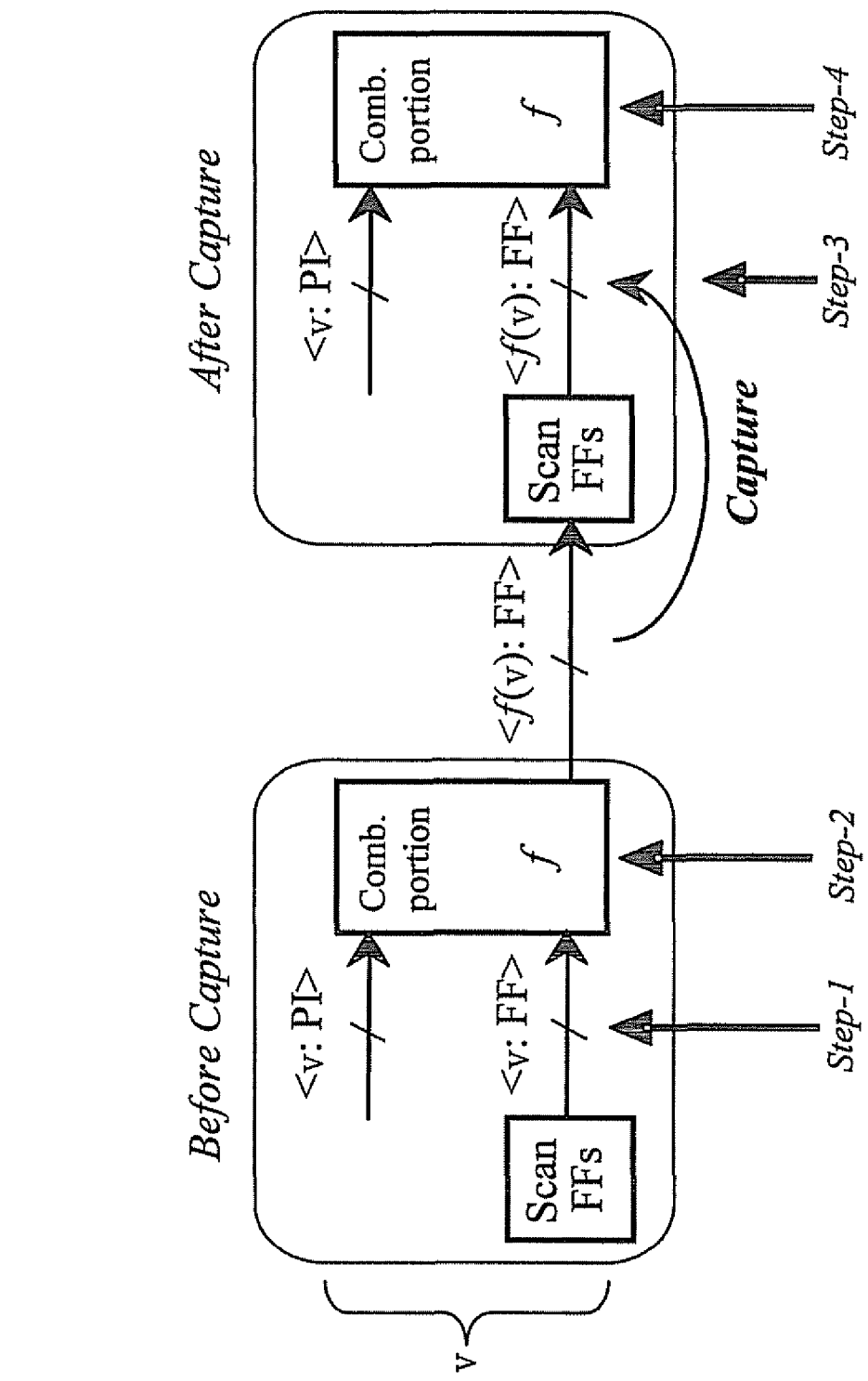
FIG. 6 explains that, in a full-scan circuit, the transition probabilities of all nodes under a test cube v can be calculated in four steps.

The probabilities of all nodes under a test vector v can be calculated in the following four steps as illustrated in FIG. 6, corresponding to the full-scan circuit.

<Step-1: Before-Capture Input Probability Assignment>

The before-capture 0 and 1 probabilities of each bit b in the test cube v are assigned according to its value as follows.

| b | BC-Prob$^0$(b) | BC-Prob$^1$(b) |
| --- | --- | --- |
| 0 | 100% | 0% |
| 1 | 0% | 100% |
| X | 50% | 50% |

<Step-2: Before-Capture Node Probability Calculation>

The before-capture 0 and 1 probabilities of each gate in the combinational portion are calculated from the input probabilities assigned in Step-1. Many methods are available for probability propagation, with different trade-offs between correlation-induced inaccuracy and computational complexity. Here, the before-capture 0 and 1 probabilities of each FF have been assigned in Step-1.

<Step-3: After-Capture Input Probability Assignment>

The effect of the capture operation is to update the outputs of scan FFs with <f(v): FF>, which is the response of the combinational portion to the test cube v at the inputs of the FFs. Thus, the after-capture 0 and 1 probabilities of the output of each FF are equal to the before-capture 0 and 1 probabilities of the input of the FF, respectively. The values of primary inputs <v: PI> remain unchanged by capture. Thus, the after-capture 0 and 1 probabilities of each primary input remain unchanged from its corresponding before-capture 0 and 1 probabilities, respectively.

<Step-4: After-Capture Node Probability Calculation>

The after-capture 0 and 1 probabilities of each gate in the combinational portion are calculated from the input probabilities assigned in Step-3. Note that the after-capture 0 and 1 probabilities of each FF have already been assigned in Step-3.

It is clear that in Step-1, any X-bit in a test cube v can be set to any logic value directly from primary inputs or indirectly through scan shift. This is why the 0 and 1 probabilities for any X-bit in a test cube are assigned to 50%.

Figure 7:
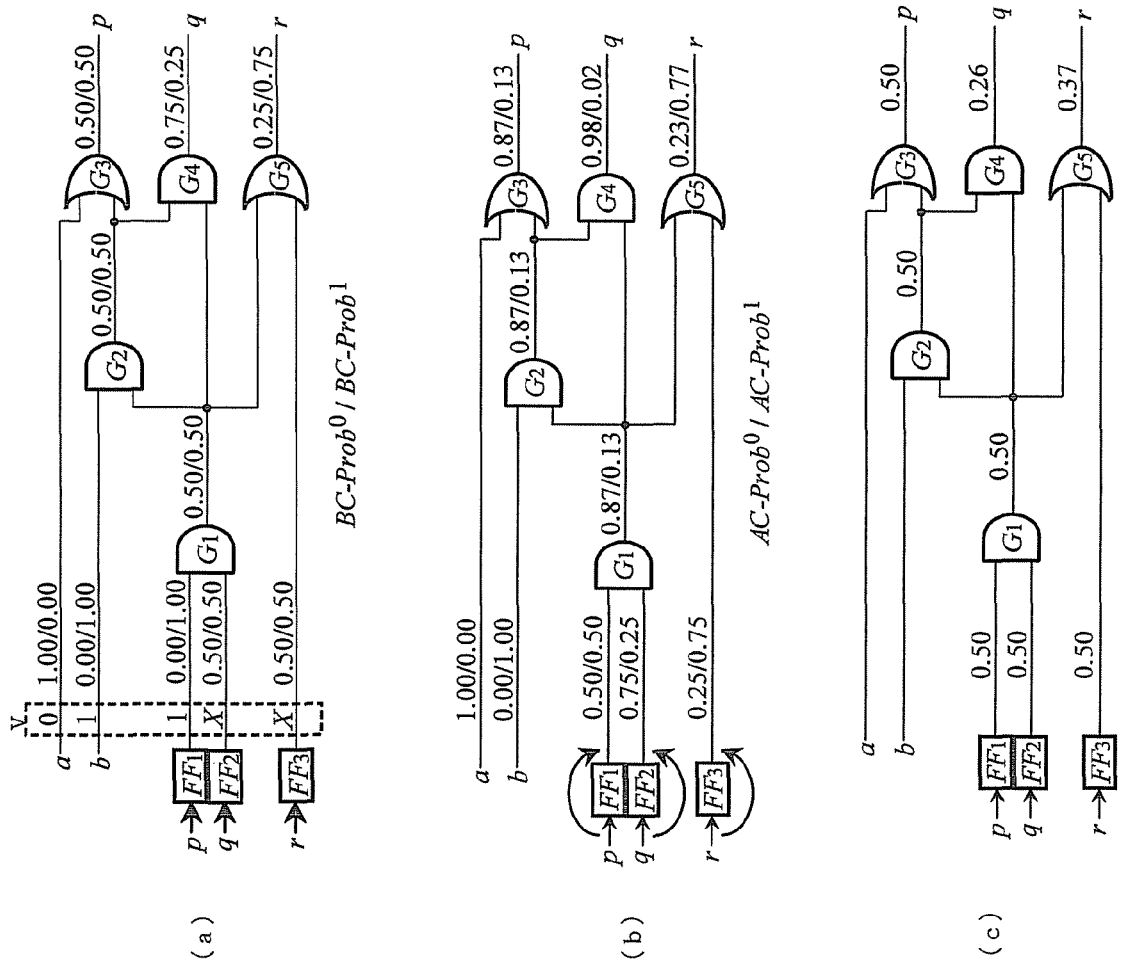
FIG. 7 shows an example of calculating node and transition probabilities.
Figure 8:
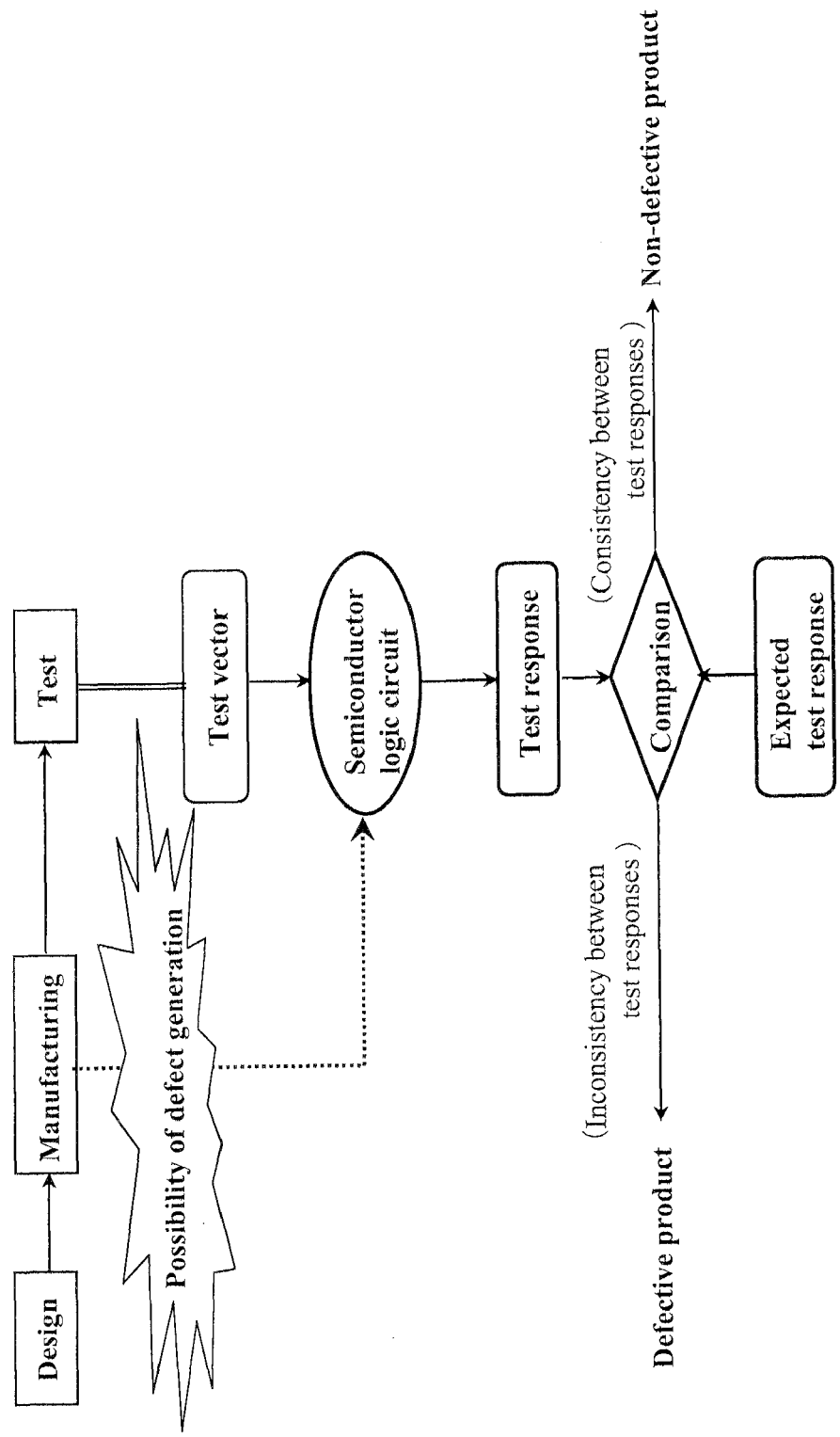
FIG. 8 explains that a semiconductor logic circuit is shipped through three stages, which are designing, manufacture and testing stages.
Figure 9:
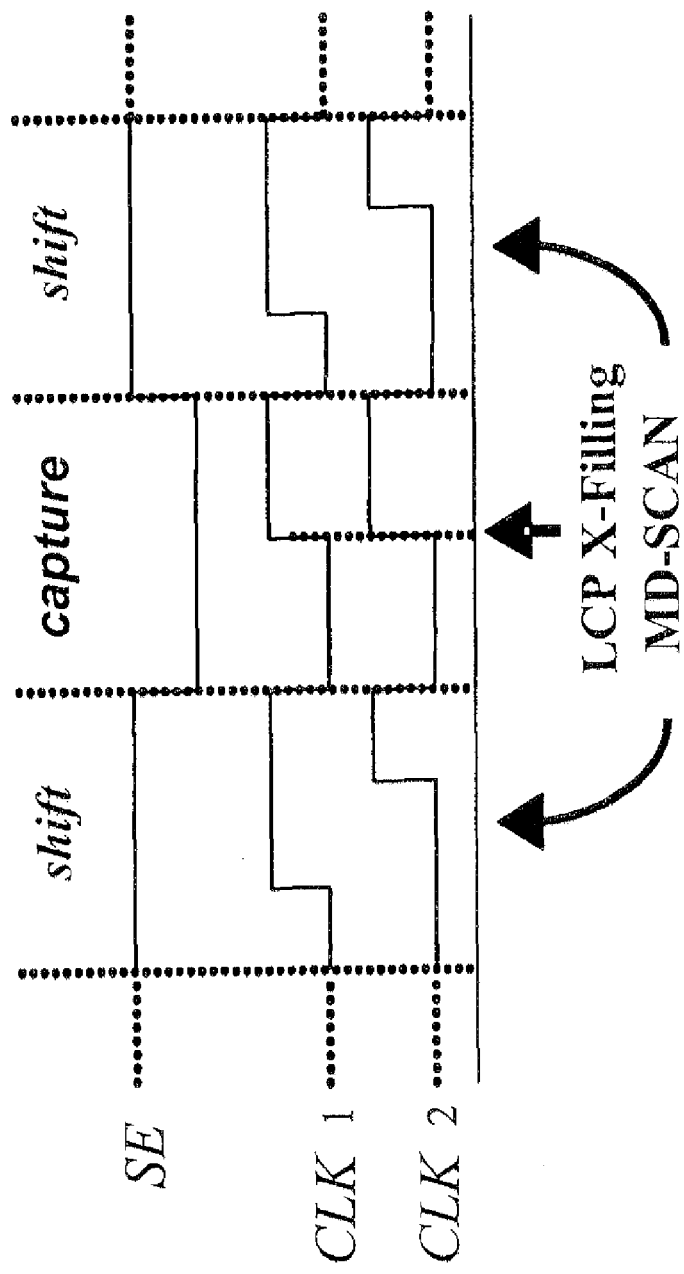
FIG. 9 shows an example of using MD-SCAN (multi-duty scan) for shift power reduction and LCP X-filling for capture power reduction.
Figure 10:
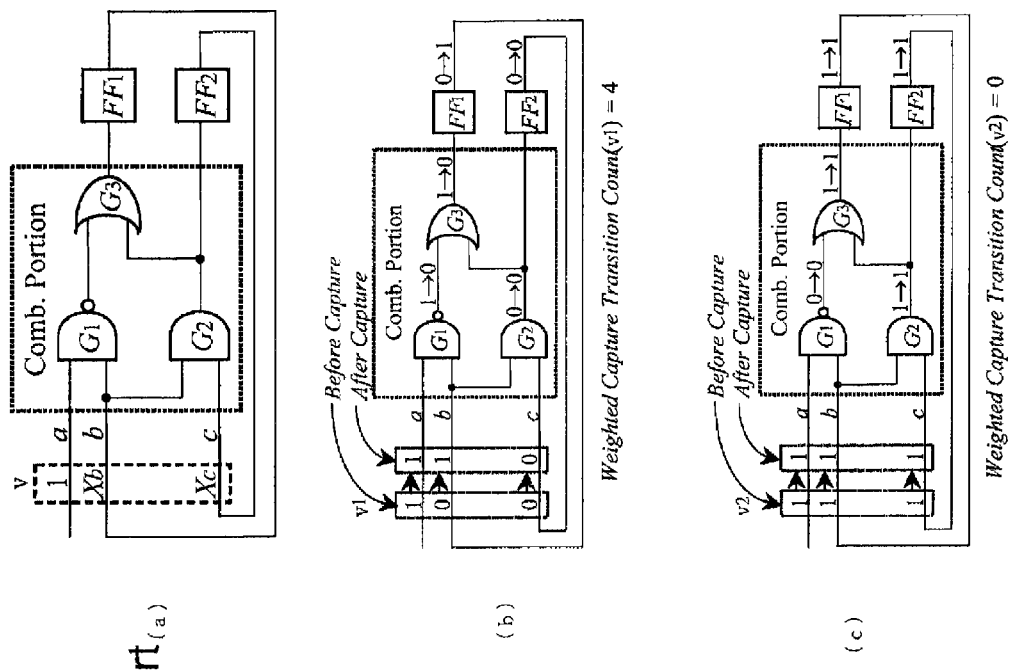
FIG. 10 explains the difference of results caused by selection in different X-filling orders.

An example of calculating node and then transition probabilities is shown in FIG. 7.

The full-scan circuit has a combinational portion of five gates (G1~G5) and three scan FFs (FF1~FF3). a and b are primary inputs, while p, q, and r are pseudo primary outputs that are connected to the inputs of FF1, FF2, and FF3, respectively.

FIGS. 7 (a) and (b) show before-capture and after-capture node probabilities, respectively. Here, suppose that a test cube v is (0, 1, 1, X, X). From these results, it is easy to calculate transition probabilities for all nodes as illustrated in FIG. 5, and the result is shown in FIG. 7 (c). For example, the output q is obtained as 0.26 by calculating BC-Prob0(q)×AC-Prob1(q)+BC-Prob1(q)×AC-Prob0(q), and the output p and r are also obtained as well. Therefore, PWT(v)=3×0.50+2×0.50+1×0.50+1×0.26+1×0.37+1×0.50+1×0.50+1×0.50=5.13.

As shown in FIG. 2, in order to select a proper logic value for an X-bit b in a test cube v for capture power reduction, one first calculates PWT (v: b=0) and PWT (v: b=1), denoting the probabilistic weighted capture transition metrics for the cases of assigning 0 and 1 to b, respectively. Then one selects the logic value corresponding to the smaller PWT value as the final value for the X-bit b. For example, in FIG. 7(a), for an X-bit b with the largest X-score in a test cube v, one first calculates PWT (v: b=0) and PWT (v: b=1), denoting the probabilistic weighted capture transition metrics for the cases of assigning 0 and 1 to b, respectively. Then one selects the logic value corresponding to the smaller PWT value as the final value for the X-bit b.

Since the probabilistic weighted capture transition metric can estimate capture power dissipation at all nodes (gates and FFs) for a test cube with X-bits, the X-filling value selection based on this metric is a highly-guided procedure, leading to a better result in capture power reduction.

The effects obtained by LCP X-filling with a highly-guided ((1) X-Score and (2) probabilistically-calculated number of weighted capture transitions) will be described here. Firstly, the concept of X-Score is used to quantify the impact of all X-bit in a test cube on capture power reduction. Structural information of a circuit, logic values of specified bits, and inter-relations among different X-bits, are all explored in X-score calculation. This makes it possible for X-scores to be used as quantitative guidance in selecting a proper X-filling target in each X-filling run. And the concept of Probabilistic Weighted Capture Transition Metric is used to estimate the capture power of a test cube with X-bits by the probabilistically-calculated number of weighted capture transitions at all nodes (gates and FFs). This new metric overcomes the limitation of the weighted switching activity metric that can only be applied for a test vector without any X-bit, and significantly improves the accuracy of capture power estimation comparing to previous methods for a test cube with X-bits. As a result, this new metric can provide better guidance in selecting a proper logic value for the target X-bit in each X-filling run. "X-score" is unique in that it quantifies the impact of each X-bit on capture power reduction, while "Probabilistic Weighted Capture Transition Metric" is unique in that it estimates whole-circuit capture power dissipation even for a test cube with X-bits. As the result, sufficient guidance in X-filling based on the two concepts leads to significant improvement in capture power reduction.

In the present preferred embodiment, logic value 0 or 1 is assigned to the X-bit with the largest X-score before PWT is calculated. Alternatively, in PWT calculation, the X-filling target to which logic value 0 or 1 is assigned can be selected by other methods.

In the embodiment of the present invention, the details of full-scan circuit like circuit structure, kinds of clock pulse, number of clock pulses, and so on, are simplified for better understanding. However, regardless of any details of the full-scan circuit, the present invention can be applied to any full-scan logic circuit (LSI circuit). That is, it can also be applied to a LSI circuit with a plurality of scan chains, a plurality of clock pulses which drive full-scan circuits. It can also be applied to a LSI circuit if the timing is different to capture a value from the combinational portion of a full-scan circuit into flip-flops.

The invention claimed is:

1. A generation device for generating a test vector for a logic circuit by assigning a logic value to each of a plurality of unspecified bits (X-bits) included in a test cube, the logic circuit being full-scan sequential circuit, the generation device comprising:

selection unit that selects, among the plurality of X-bits, a target X-bit, which is an X-bit to which a logic value is to be assigned, where the selection is based on a selection criterion in which the X-bit with the largest X-score is selected wherein the X-score is the degree of spread of signal value transition in the logic circuit;

capture transition metric calculation unit that calculates capture transition metric (PWT(v)) for a test cube (v) including at least one X-bit, with outputs of all of logic elements in the logic circuit, using probabilistic weighted formula shown below; and logic value assignment unit that assigns, to the selected target X-bit (b), a logic value which causes a smaller capture transition metric, by applying the capture transition metric calculation unit to a first test cube obtained by assigning a logic value 0 to the selected target X-bit and to a second test cube obtained by assigning a logic value 1 to the target X-bit, and by comparing a capture transition metric caused by a first test cube (PWT (v: b=0)) and a capture transition metric caused by a second test cube (PWT (v: b=1)), wherein logic values are assigned to target X-bits based on calculation results by the capture transition metric calculation unit until logic values are assigned to all of the plurality of X-bits, and $$PWT(v) = \sum_{i=1}^{n} (w_i \times p_i)$$

where n is number of all nodes of the logic circuit, wi denotes a factor related to node i for calculating a capture transition metric, and pi is transition probability which is probability that a transition (0 to 1 or 1 to 0) occurs at an output of node i.

2. The generation device according to claim 1, wherein the capture transition metric calculation unit calculates capture transition metric caused by the test cube, based on calculation results of probabilities of signal transitions in all of logic elements constituting the logic circuit before and after scan capture, the probabilities of signal transitions being obtained by calculating signal probabilities in all the logic elements.

3. The generation device according to claim 1, wherein the logic value assignment unit comprises:
comparison unit that compares a capture transition metric caused by a first test cube obtained by assigning a logic value 0 (PWT (v: b=0)) to the selected target X-bit and a capture transition metric caused by a second test cube obtained by assigning a logic value 1 (PWT (v: b=1)) to the selected target X-bit; and
decision unit decides a logic value, 0 or 1, as a logic value to be assigned, corresponding to the smaller capture transition metric, based on the comparison result obtained by the comparison unit.

4. The generation device according to claim 1, wherein the capture transition metric calculation unit assumes and applies probability of logic value of the selected target X-bit to be 1 or probability of logic value of the selected target X-bit to be 0 as the transition probability.

5. A generation method for generating a test vector for a logic circuit by assigning logic values to each of a plurality of unspecified bits (X-bits) included in a test cube, the logic circuit being full-scan designed sequential circuit, the generation method comprising:
a selection step of causing selection unit to select, among the plurality of X-bits, a target X-bit, which is an X-bit, to which a logic value is to be assigned, where the selection is based on a selection criterion in which the X-bit with the largest X-score is selected wherein the X-score is the degree of spread of signal value transition in the logic circuit;
a capture transition metric calculation step of causing capture transition metric calculation unit to calculate capture transition metric (PWT(v)) caused by a test cube (v) including at least one X-bit, with outputs of all of logic elements in the logic circuit, using probabilistic weighted formula shown below; and
a logic value assignment step of causing logic value assignment unit to assign, to the selected target X-bit (b), a logic value which causes a smaller capture transition metric, by applying the capture transition metric calculation unit to a first test cube obtained by assigning a logic value 0 to the selected target X-bit and to a second test cube obtained by assigning a logic value 1 to the selected target X-bit, and by comparing a capture transition metric caused by a first test cube (PWT (v: b=0)) and a capture transition metric caused by a second test cube (PWT (v: b=1)),
wherein logic values are assigned to target X-bits based on calculation results by the capture transition metric calculation unit until logic values are assigned to all of the plurality of X-bits, and $$PWT(v) = \sum_{i=1}^{n} (w_i \times p_i)$$

where n is number of all nodes of the logic circuit, wi denotes a factor related to node i for calculating a capture transition metric, and pi is transition probability which is probability that a transition (0 to 1 or 1 to 0) occurs at an output of node i.

6. The generation method according to claim 5, wherein, in the capture transition metric calculation step, the capture transition metric calculation unit calculates capture transition metric caused by the test cube, based on calculation results of probabilities of signal transitions in all of logic elements constituting the logic circuit before and after scan capture, the probabilities of signal transitions being obtained by calculating signal probabilities in all the logic elements.

7. The generation method according to claim 5, wherein the logic value assignment step comprises:
a comparison step of causing comparison unit to compare a capture transition metric caused by a first test cube obtained by assigning a logic value 0 to the selected target X-bit and a capture transition metric caused by a second test cube obtained by assigning a logic value 1 to the selected target X-bit; and
a decision step of causing decision unit to decide a logic value, 0 or 1, as a logic value to be assigned, corresponding to the smaller capture transition metric, based on the comparison result obtained by the comparison unit.

8. The generation method according to claim 5, wherein, in the capture transition metric calculation step, the capture transition metric calculation unit assumes and applies probability of logic value of the selected target X-bit to be 1 or probability of logic value of the selected target X-bit to be 0 as the transition probability.

9. A generation method, implemented in a computer, for generating a test vector for a logic circuit by assigning logic values to each of a plurality of unspecified bits (X-bits) included in a test cube, the logic circuit being full-scan designed sequential circuit, the generation method comprising:
a selection step of causing selection unit to select, among the plurality of X-bits, a target X-bit, which is an X-bit, to which a logic value is to be assigned, where the selection is based on a selection criterion in which the X-bit with the largest X-score is selected wherein the X-score is the degree of spread of signal value transition in the logic circuit;
a capture transition metric calculation step of causing capture transition metric calculation unit to calculate capture transition metric (PWT(v)) caused by a test cube (v) including at least one X-bit, with outputs of all of logic elements in the logic circuit, using probabilistic weighted formula shown below; and
a logic value assignment step of causing logic value assignment unit to assign, to the selected target X-bit, a logic value which causes a smaller capture transition metric, by applying the capture transition metric calculation unit to a first test cube obtained by assigning a logic value 0 to the selected target X-bit and to a second test cube obtained by assigning a logic value 1 to the selected target X-bit, and by comparing a capture transition metric caused by a first test cube and a capture transition metric caused by a second test cube, wherein logic values are assigned to target X-bits based on calculation results by the capture transition metric calculation unit until logic values are assigned to all of the plurality of X-bits, and $$PWT(v) = \sum_{i=1}^{n} (w_i \times p_i)$$

where n is number of all nodes of the logic circuit, wi denotes a factor related to node i for calculating a capture transition metric, and pi is transition probability which is probability that a transition (0 to 1 or 1 to 0) occurs at an output of node i.

10. A non-transitory computer readable medium comprising a program which, when executed, performs action for generating a test vector for a logic circuit by assigning logic values to each of a plurality of unspecified bits (X-bits) included in a test cube, the logic circuit being full-scan designed sequential circuit, the generation method comprising:

a selection step of causing selection unit to select, among the plurality of X-bits, a target X-bit, which is an X-bit, to which a logic value is to be assigned, where the selection is based on a selection criterion in which the X-bit with the largest X-score is selected wherein the X-score is the degree of spread of signal value transition in the logic circuit;

a capture transition metric calculation step of causing capture transition metric calculation unit to calculate capture transition metric (PWT(v)) caused by a test cube (v) including at least one X-bit, with outputs of all of logic elements in the logic circuit, using probabilistic weighted formula shown below; and a logic value assignment step of causing logic value assignment unit to assign, to the selected target X-bit, a logic value which causes a smaller capture transition metric, by applying the capture transition metric calculation unit to a first test cube obtained by assigning a logic value 0 to the selected target X-bit and to a second test cube obtained by assigning a logic value 1 to the selected target X-bit, and by comparing a capture transition metric caused by a first test cube and a capture transition metric caused by a second test cube, wherein logic values are assigned to target X-bits based on calculation results by the capture transition metric calculation unit until logic values are assigned to all of the plurality of X-bits, and $$PWT(v) = \sum_{i=1}^{n} (w_i \times p_i)$$

where n is number of all nodes of the logic circuit, wi denotes a factor related to node i for calculating a capture transition metric, and pi is transition probability which is probability that a transition (0 to 1 or 1 to 0) occurs at an output of node i.

* * * * *